(12) United States Patent
Chen et al.

(10) Patent No.: US 8,139,844 B2
(45) Date of Patent: Mar. 20, 2012

(54) METHODS AND SYSTEMS FOR DETERMINING A DEFECT CRITICALITY INDEX FOR DEFECTS ON WAFERS

(75) Inventors: Chien-Huei (Adam) Chen, San Jose, CA (US); Yan Xiong, Sunnyvale, CA (US); Jianxin Zhang, Santa Clara, CA (US); Ellis Chang, Saratoga, CA (US); Tsung-Pao Fang, Milpitas, CA (US)

(73) Assignee: KLA-Tencor Corp., San Jose, CA (US)

( * ) Notice: Subject to any disclaimer, the term of this patent is extended or adjusted under 35 U.S.C. 154(b) by 1010 days.

(21) Appl. No.: 12/102,343

(22) Filed: Apr. 14, 2008

(65) Prior Publication Data

US 2009/0257645 A1    Oct. 15, 2009

(51) Int. Cl.
*G06K 9/00* (2006.01)

(52) U.S. Cl. .......................... 382/145; 382/147

(58) Field of Classification Search .................. None
See application file for complete search history.

(56) References Cited

U.S. PATENT DOCUMENTS

| | | |
|---|---|---|
| 3,495,269 A | 2/1970 | Mutschler et al. |
| 3,496,352 A | 2/1970 | Jugle |
| 3,909,602 A | 9/1975 | Micka |
| 4,015,203 A | 3/1977 | Verkuil |
| 4,247,203 A | 1/1981 | Levy et al. |
| 4,347,001 A | 8/1982 | Levy et al. |
| 4,378,159 A | 3/1983 | Galbraith |
| 4,448,532 A | 5/1984 | Joseph et al. |
| 4,532,650 A | 7/1985 | Wihl et al. |
| 4,555,798 A | 11/1985 | Broadbent, Jr. et al. |
| 4,578,810 A | 3/1986 | MacFarlane et al. |
| 4,579,455 A | 4/1986 | Levy et al. |
| 4,595,289 A | 6/1986 | Feldman et al. |
| 4,599,558 A | 7/1986 | Castellano et al. |
| 4,633,504 A | 12/1986 | Wihl |
| 4,641,353 A | 2/1987 | Kobayashi |
| 4,641,967 A | 2/1987 | Pecen |
| 4,734,721 A | 3/1988 | Boyer et al. |

(Continued)

FOREIGN PATENT DOCUMENTS

EP    0032197    7/1981

(Continued)

OTHER PUBLICATIONS

Huang et al, "Using Design Based Binning to Improve Defect Excursion Control for 45nm Production", Semiconductor Manufacturing, 2007, ISSM 2007, International Symposium on, Oct. 2007, pp. 1-3.*

(Continued)

*Primary Examiner* — F. L. Evans
(74) *Attorney, Agent, or Firm* — Ann Marie Mewherter

(57) ABSTRACT

Various methods and systems for determining a defect criticality index (DCI) for defects on wafers are provided. One computer-implemented method includes determining critical area information for a portion of a design for a wafer surrounding a defect detected on the wafer by an inspection system based on a location of the defect reported by the inspection system and a size of the defect reported by the inspection system. The method also includes determining a DCI for the defect based on the critical area information, a location of the defect with respect to the critical area information, and the reported size of the defect.

19 Claims, 3 Drawing Sheets

U.S. PATENT DOCUMENTS

| | | | |
|---|---|---|---|
| 4,748,327 A | 5/1988 | Shinozaki et al. |
| 4,758,094 A | 7/1988 | Wihl |
| 4,766,324 A | 8/1988 | Saadat et al. |
| 4,799,175 A | 1/1989 | Sano et al. |
| 4,805,123 A | 2/1989 | Specht et al. |
| 4,812,756 A | 3/1989 | Curtis et al. |
| 4,814,829 A | 3/1989 | Kosugi et al. |
| 4,817,123 A | 3/1989 | Sones et al. |
| 4,845,558 A | 7/1989 | Tsai et al. |
| 4,877,326 A | 10/1989 | Chadwick et al. |
| 4,926,489 A | 5/1990 | Danielson et al. |
| 4,928,313 A | 5/1990 | Leonard et al. |
| 5,046,109 A | 9/1991 | Fujimori et al. |
| 5,124,927 A | 6/1992 | Hopewell et al. |
| 5,189,481 A | 2/1993 | Jann et al. |
| 5,355,212 A | 10/1994 | Wells et al. |
| 5,444,480 A | 8/1995 | Sumita |
| 5,453,844 A | 9/1995 | George et al. |
| 5,459,520 A | 10/1995 | Sasaki |
| 5,481,624 A | 1/1996 | Kamon |
| 5,485,091 A | 1/1996 | Verkuil |
| 5,497,381 A | 3/1996 | O'Donoghue et al. |
| 5,528,153 A | 6/1996 | Taylor et al. |
| 5,544,256 A | 8/1996 | Brecher et al. |
| 5,563,702 A | 10/1996 | Emery et al. |
| 5,572,598 A | 11/1996 | Wihl et al. |
| 5,578,821 A | 11/1996 | Meisberger et al. |
| 5,594,247 A | 1/1997 | Verkuil et al. |
| 5,608,538 A | 3/1997 | Edgar et al. |
| 5,619,548 A | 4/1997 | Koppel |
| 5,621,519 A | 4/1997 | Frost et al. |
| 5,644,223 A | 7/1997 | Verkuil |
| 5,650,731 A | 7/1997 | Fung |
| 5,661,408 A | 8/1997 | Kamieniecki et al. |
| 5,689,614 A | 11/1997 | Gronet et al. |
| 5,694,478 A | 12/1997 | Braier et al. |
| 5,696,835 A | 12/1997 | Hennessey et al. |
| 5,703,969 A | 12/1997 | Hennessey et al. |
| 5,737,072 A | 4/1998 | Emery et al. |
| 5,742,658 A | 4/1998 | Tiffin et al. |
| 5,754,678 A | 5/1998 | Hawthorne et al. |
| 5,767,691 A | 6/1998 | Verkuil |
| 5,767,693 A | 6/1998 | Verkuil |
| 5,771,317 A | 6/1998 | Edgar |
| 5,773,989 A | 6/1998 | Edelman et al. |
| 5,774,179 A | 6/1998 | Chevrette et al. |
| 5,795,685 A | 8/1998 | Liebmann et al. |
| 5,822,218 A | 10/1998 | Moosa et al. |
| 5,831,865 A | 11/1998 | Berezin et al. |
| 5,834,941 A | 11/1998 | Verkuil |
| 5,852,232 A | 12/1998 | Samsavar et al. |
| 5,866,806 A | 2/1999 | Samsavar et al. |
| 5,874,733 A | 2/1999 | Silver et al. |
| 5,884,242 A | 3/1999 | Meier et al. |
| 5,889,593 A | 3/1999 | Bareket |
| 5,917,332 A | 6/1999 | Chen et al. |
| 5,932,377 A | 8/1999 | Ferguson et al. |
| 5,940,458 A | 8/1999 | Suk |
| 5,948,972 A | 9/1999 | Samsavar et al. |
| 5,955,661 A | 9/1999 | Samsavar et al. |
| 5,965,306 A | 10/1999 | Mansfield et al. |
| 5,978,501 A | 11/1999 | Badger et al. |
| 5,980,187 A | 11/1999 | Verhovsky |
| 5,986,263 A | 11/1999 | Hiroi et al. |
| 5,991,699 A | 11/1999 | Kulkarni et al. |
| 5,999,003 A | 12/1999 | Steffan et al. |
| 6,011,404 A | 1/2000 | Ma et al. |
| 6,014,461 A | 1/2000 | Hennessey et al. |
| 6,040,912 A | 3/2000 | Zika et al. |
| 6,052,478 A | 4/2000 | Wihl et al. |
| 6,060,709 A | 5/2000 | Verkuil et al. |
| 6,072,320 A | 6/2000 | Verkuil |
| 6,076,465 A | 6/2000 | Vacca et al. |
| 6,078,738 A | 6/2000 | Garza et al. |
| 6,091,257 A | 7/2000 | Verkuil et al. |
| 6,091,846 A | 7/2000 | Lin et al. |
| 6,097,196 A | 8/2000 | Verkuil et al. |
| 6,097,887 A | 8/2000 | Hardikar et al. |
| 6,104,206 A | 8/2000 | Verkuil |
| 6,104,835 A | 8/2000 | Han |
| 6,117,598 A | 9/2000 | Imai |
| 6,121,783 A | 9/2000 | Horner et al. |
| 6,122,017 A | 9/2000 | Taubman |
| 6,122,046 A | 9/2000 | Almogy |
| 6,137,570 A | 10/2000 | Chuang et al. |
| 6,141,038 A | 10/2000 | Young et al. |
| 6,146,627 A | 11/2000 | Muller |
| 6,171,737 B1 | 1/2001 | Phan et al. |
| 6,175,645 B1 | 1/2001 | Elyasaf et al. |
| 6,184,929 B1 | 2/2001 | Noda et al. |
| 6,184,976 B1 | 2/2001 | Park et al. |
| 6,191,605 B1 | 2/2001 | Miller et al. |
| 6,201,999 B1 | 3/2001 | Jevtic |
| 6,202,029 B1 | 3/2001 | Verkuil et al. |
| 6,205,239 B1 | 3/2001 | Lin et al. |
| 6,224,638 B1 | 5/2001 | Jevtic et al. |
| 6,233,719 B1 | 5/2001 | Hardikar et al. |
| 6,246,787 B1 | 6/2001 | Hennessey et al. |
| 6,248,485 B1 | 6/2001 | Cuthbert |
| 6,248,486 B1 | 6/2001 | Dirksen et al. |
| 6,259,960 B1 | 7/2001 | Inokuchi |
| 6,266,437 B1 | 7/2001 | Eichel et al. |
| 6,267,005 B1 | 7/2001 | Samsavar et al. |
| 6,268,093 B1 | 7/2001 | Kenan et al. |
| 6,272,236 B1 | 8/2001 | Pierrat et al. |
| 6,282,309 B1 | 8/2001 | Emery |
| 6,292,582 B1 | 9/2001 | Lin et al. |
| 6,324,298 B1 | 11/2001 | O'Dell et al. |
| 6,344,640 B1 | 2/2002 | Rhoads |
| 6,363,166 B1 | 3/2002 | Wihl et al. |
| 6,373,975 B1 | 4/2002 | Bula et al. |
| 6,388,747 B2 | 5/2002 | Nara et al. |
| 6,393,602 B1 | 5/2002 | Atchinson et al. |
| 6,415,421 B2 | 7/2002 | Anderson et al. |
| 6,445,199 B1 | 9/2002 | Satya et al. |
| 6,451,690 B1 | 9/2002 | Matsumoto |
| 6,466,314 B1 | 10/2002 | Lehman |
| 6,466,315 B1 | 10/2002 | Karpol et al. |
| 6,470,489 B1 | 10/2002 | Chang et al. |
| 6,483,938 B1 | 11/2002 | Hennessey et al. |
| 6,513,151 B1 | 1/2003 | Erhardt et al. |
| 6,526,164 B1 | 2/2003 | Mansfield et al. |
| 6,529,621 B1 | 3/2003 | Glasser et al. |
| 6,535,628 B2 | 3/2003 | Smargiassi et al. |
| 6,539,106 B1 | 3/2003 | Gallarda et al. |
| 6,569,691 B1 | 5/2003 | Jastrzebski et al. |
| 6,581,193 B1 | 6/2003 | McGhee et al. |
| 6,593,748 B1 | 7/2003 | Halliyal et al. |
| 6,597,193 B2 | 7/2003 | Lagowski et al. |
| 6,602,728 B1 | 8/2003 | Liebmann et al. |
| 6,608,681 B2 | 8/2003 | Tanaka et al. |
| 6,614,520 B1 | 9/2003 | Bareket et al. |
| 6,631,511 B2 | 10/2003 | Haffner |
| 6,636,301 B1 | 10/2003 | Kvamme et al. |
| 6,642,066 B1 | 11/2003 | Halliyal et al. |
| 6,658,640 B2 | 12/2003 | Weed |
| 6,665,065 B1 | 12/2003 | Phan et al. |
| 6,670,082 B2 | 12/2003 | Liu et al. |
| 6,680,621 B2 | 1/2004 | Savtchouk et al. |
| 6,691,052 B1 | 2/2004 | Maurer |
| 6,701,004 B1 | 3/2004 | Shykind et al. |
| 6,718,526 B1 | 4/2004 | Eldredge et al. |
| 6,721,695 B1 | 4/2004 | Chen et al. |
| 6,734,696 B2 | 5/2004 | Horner et al. |
| 6,738,954 B1 | 5/2004 | Allen et al. |
| 6,751,519 B1 | 6/2004 | Satya et al. |
| 6,753,954 B2 | 6/2004 | Chen |
| 6,757,645 B2 | 6/2004 | Chang |
| 6,759,655 B2 | 7/2004 | Nara et al. |
| 6,771,806 B1 | 8/2004 | Satya et al. |
| 6,775,818 B2 | 8/2004 | Taravade et al. |
| 6,777,147 B1 | 8/2004 | Fonseca et al. |
| 6,777,676 B1 | 8/2004 | Wang et al. |
| 6,778,695 B1 | 8/2004 | Schellenberg et al. |
| 6,779,159 B2 | 8/2004 | Yokoyama et al. |
| 6,784,446 B1 | 8/2004 | Phan et al. |
| 6,788,400 B2 | 9/2004 | Chen |

| Patent/Pub No. | Date | Name |
|---|---|---|
| 6,789,032 B2 | 9/2004 | Barbour et al. |
| 6,803,554 B2 | 10/2004 | Ye et al. |
| 6,806,456 B1 | 10/2004 | Ye et al. |
| 6,807,503 B2 | 10/2004 | Ye et al. |
| 6,813,572 B2 | 11/2004 | Satya et al. |
| 6,820,028 B2 | 11/2004 | Ye et al. |
| 6,828,542 B2 | 12/2004 | Ye et al. |
| 6,842,225 B1 | 1/2005 | Irie |
| 6,859,746 B1 | 2/2005 | Stirton |
| 6,879,924 B2 | 4/2005 | Ye et al. |
| 6,882,745 B2 | 4/2005 | Brankner |
| 6,884,984 B2 | 4/2005 | Ye et al. |
| 6,886,153 B1 | 4/2005 | Bevis |
| 6,892,156 B2 | 5/2005 | Ye et al. |
| 6,902,855 B2 | 6/2005 | Peterson et al. |
| 6,906,305 B2 | 6/2005 | Pease et al. |
| 6,918,101 B1 | 7/2005 | Satya et al. |
| 6,937,753 B1 | 8/2005 | O'Dell et al. |
| 6,948,141 B1 | 9/2005 | Satya et al. |
| 6,959,255 B2 | 10/2005 | Ye et al. |
| 6,966,047 B1 | 11/2005 | Glasser |
| 6,969,837 B2 | 11/2005 | Ye et al. |
| 6,969,864 B2 | 11/2005 | Ye et al. |
| 6,983,060 B1 | 1/2006 | Martinent-Catalot et al. |
| 6,988,045 B2 | 1/2006 | Purdy |
| 7,003,755 B2 | 2/2006 | Pang et al. |
| 7,003,758 B2 | 2/2006 | Ye et al. |
| 7,012,438 B1 | 3/2006 | Miller et al. |
| 7,026,615 B2 | 4/2006 | Takane |
| 7,027,143 B1 | 4/2006 | Stokowski et al. |
| 7,030,966 B2 | 4/2006 | Hansen |
| 7,030,997 B2 | 4/2006 | Neureuther et al. |
| 7,053,355 B2 | 5/2006 | Ye et al. |
| 7,061,625 B1 | 6/2006 | Hwang |
| 7,071,833 B2 | 7/2006 | Nagano et al. |
| 7,103,484 B1 | 9/2006 | Shi et al. |
| 7,106,895 B1 | 9/2006 | Goldberg et al. |
| 7,107,517 B1 | 9/2006 | Suzuki et al. |
| 7,107,571 B2 | 9/2006 | Chang et al. |
| 7,111,277 B2 | 9/2006 | Ye et al. |
| 7,114,143 B2 | 9/2006 | Hanson et al. |
| 7,114,145 B2 | 9/2006 | Ye et al. |
| 7,117,477 B2 | 10/2006 | Ye et al. |
| 7,117,478 B2 | 10/2006 | Ye et al. |
| 7,120,285 B1 | 10/2006 | Spence |
| 7,120,895 B2 | 10/2006 | Ye et al. |
| 7,123,356 B1 | 10/2006 | Stokowski |
| 7,124,386 B2 | 10/2006 | Smith |
| 7,133,548 B2 | 11/2006 | Kenan et al. |
| 7,135,344 B2 | 11/2006 | Nehmadi |
| 7,136,143 B2 | 11/2006 | Smith |
| 7,152,215 B2 | 12/2006 | Smith |
| 7,162,071 B2 | 1/2007 | Hung et al. |
| 7,171,334 B2 | 1/2007 | Gassner |
| 7,174,520 B2 | 2/2007 | White |
| 7,194,709 B2 | 3/2007 | Brankner |
| 7,207,017 B1 | 4/2007 | Tabery et al. |
| 7,231,628 B2 | 6/2007 | Pack et al. |
| 7,236,847 B2 | 6/2007 | Marella |
| 7,379,175 B1 | 5/2008 | Stokowski et al. |
| 7,383,156 B2 | 6/2008 | Matsusita et al. |
| 7,386,839 B2 | 6/2008 | Golender et al. |
| 7,418,124 B2 | 8/2008 | Peterson et al. |
| 7,424,145 B2 | 9/2008 | Horie et al. |
| 7,676,077 B2 | 3/2010 | Kulkarni et al. |
| 7,738,093 B2 | 6/2010 | Alles et al. |
| 7,739,064 B1 | 6/2010 | Ryker et al. |
| 2001/0019625 A1 | 9/2001 | Kenan et al. |
| 2001/0022858 A1 | 9/2001 | Komiya et al. |
| 2001/0043735 A1 | 11/2001 | Smargiassi et al. |
| 2002/0019729 A1 | 2/2002 | Chang et al. |
| 2002/0026626 A1 | 2/2002 | Randall et al. |
| 2002/0033449 A1 | 3/2002 | Nakasuji et al. |
| 2002/0035461 A1 | 3/2002 | Chang et al. |
| 2002/0035641 A1 | 3/2002 | Kurose |
| 2002/0088951 A1 | 7/2002 | Chen |
| 2002/0090746 A1 | 7/2002 | Xu et al. |
| 2002/0134936 A1 | 9/2002 | Matsui et al. |
| 2002/0144230 A1 | 10/2002 | Rittman |
| 2002/0164065 A1 | 11/2002 | Cai et al. |
| 2002/0176096 A1 | 11/2002 | Sentoku et al. |
| 2002/0181756 A1 | 12/2002 | Shibuya et al. |
| 2002/0186878 A1 | 12/2002 | Hoon et al. |
| 2002/0192578 A1 | 12/2002 | Tanaka et al. |
| 2003/0014146 A1 | 1/2003 | Fujii |
| 2003/0017664 A1 | 1/2003 | Pnueli et al. |
| 2003/0022401 A1 | 1/2003 | Hamamatsu et al. |
| 2003/0033046 A1 | 2/2003 | Yoshitake et al. |
| 2003/0048458 A1 | 3/2003 | Mieher |
| 2003/0048939 A1 | 3/2003 | Lehman |
| 2003/0057971 A1 | 3/2003 | Nishiyama et al. |
| 2003/0086081 A1 | 5/2003 | Lehman |
| 2003/0094572 A1 | 5/2003 | Matsui et al. |
| 2003/0098805 A1 | 5/2003 | Bizjak |
| 2003/0128870 A1 | 7/2003 | Pease et al. |
| 2003/0138138 A1 | 7/2003 | Vacca et al. |
| 2003/0138978 A1 | 7/2003 | Tanaka et al. |
| 2003/0169916 A1 | 9/2003 | Hayashi et al. |
| 2003/0192015 A1 | 10/2003 | Liu |
| 2003/0207475 A1 | 11/2003 | Nakasuji et al. |
| 2003/0223639 A1 | 12/2003 | Shlain et al. |
| 2003/0226951 A1 | 12/2003 | Ye et al. |
| 2003/0228714 A1 | 12/2003 | Smith |
| 2003/0229410 A1 | 12/2003 | Smith |
| 2003/0229412 A1 | 12/2003 | White |
| 2003/0229868 A1 | 12/2003 | White |
| 2003/0229875 A1 | 12/2003 | Smith |
| 2003/0229880 A1 | 12/2003 | White |
| 2003/0229881 A1 | 12/2003 | White |
| 2003/0237064 A1 | 12/2003 | White et al. |
| 2004/0030430 A1 | 2/2004 | Matsuoka |
| 2004/0032908 A1 | 2/2004 | Hagai et al. |
| 2004/0049722 A1 | 3/2004 | Matsushita |
| 2004/0052411 A1 | 3/2004 | Qian et al. |
| 2004/0057611 A1 | 3/2004 | Lee |
| 2004/0091142 A1 | 5/2004 | Peterson et al. |
| 2004/0094762 A1 | 5/2004 | Hess et al. |
| 2004/0098216 A1 | 5/2004 | Ye et al. |
| 2004/0102934 A1 | 5/2004 | Chang |
| 2004/0107412 A1 | 6/2004 | Pack et al. |
| 2004/0119036 A1 | 6/2004 | Ye et al. |
| 2004/0120569 A1 | 6/2004 | Hung et al. |
| 2004/0133369 A1 | 7/2004 | Pack et al. |
| 2004/0174506 A1 | 9/2004 | Smith |
| 2004/0223639 A1 | 11/2004 | Sato |
| 2004/0228515 A1 | 11/2004 | Okabe et al. |
| 2004/0234120 A1 | 11/2004 | Honda et al. |
| 2004/0243320 A1 | 12/2004 | Chang et al. |
| 2004/0254752 A1 | 12/2004 | Wisniewski et al. |
| 2005/0004774 A1 | 1/2005 | Volk et al. |
| 2005/0008218 A1 | 1/2005 | O'Dell et al. |
| 2005/0010890 A1 | 1/2005 | Nehmadi et al. |
| 2005/0062962 A1 | 3/2005 | Fairley |
| 2005/0117796 A1 | 6/2005 | Matsui |
| 2005/0132306 A1 | 6/2005 | Smith |
| 2005/0141764 A1 | 6/2005 | Tohyama et al. |
| 2005/0166174 A1 | 7/2005 | Ye et al. |
| 2005/0184252 A1 | 8/2005 | Ogawa et al. |
| 2005/0190957 A1 | 9/2005 | Cai et al. |
| 2005/0198602 A1 | 9/2005 | Brankner |
| 2006/0000964 A1 | 1/2006 | Ye et al. |
| 2006/0036979 A1 | 2/2006 | Zurbrick et al. |
| 2006/0048089 A1 | 3/2006 | Schwarzbaned |
| 2006/0051682 A1 | 3/2006 | Hess et al. |
| 2006/0062445 A1 | 3/2006 | Verma et al. |
| 2006/0082763 A1 | 4/2006 | The et al. |
| 2006/0159333 A1 | 7/2006 | Ishikawa |
| 2006/0161452 A1 | 7/2006 | Hess et al. |
| 2006/0193506 A1 | 8/2006 | Dorphan et al. |
| 2006/0193507 A1 | 8/2006 | Sali et al. |
| 2006/0236294 A1 | 10/2006 | Saidin |
| 2006/0236297 A1 | 10/2006 | Melvin et al. |
| 2006/0239536 A1 | 10/2006 | Shibuya |
| 2006/0265145 A1 | 11/2006 | Huet et al. |
| 2006/0266243 A1 | 11/2006 | Percin et al. |
| 2006/0269120 A1 | 11/2006 | Nehmadi et al. |
| 2006/0273242 A1 | 12/2006 | Hunsche et al. |
| 2006/0273266 A1 | 12/2006 | Preil et al. |

| | | | |
|---|---|---|---|
| 2006/0291714 | A1 | 12/2006 | Wu et al. |
| 2006/0292463 | A1 | 12/2006 | Best et al. |
| 2007/0002322 | A1 | 1/2007 | Borodovsky et al. |
| 2007/0019171 | A1 | 1/2007 | Smith |
| 2007/0031745 | A1 | 2/2007 | Ye et al. |
| 2007/0032896 | A1 | 2/2007 | Ye et al. |
| 2007/0035322 | A1 | 2/2007 | Kang et al. |
| 2007/0035712 | A1 | 2/2007 | Gassner et al. |
| 2007/0035728 | A1 | 2/2007 | Kekare et al. |
| 2007/0052963 | A1 | 3/2007 | Orbon |
| 2007/0064995 | A1 | 3/2007 | Oaki et al. |
| 2007/0156379 | A1 | 7/2007 | Kulkarni et al. |
| 2007/0230770 | A1 | 10/2007 | Kulkarni et al. |
| 2007/0248257 | A1 | 10/2007 | Bruce et al. |
| 2007/0280527 | A1 | 12/2007 | Almogy et al. |
| 2007/0288219 | A1 | 12/2007 | Zafar et al. |
| 2008/0049994 | A1 | 2/2008 | Rognin et al. |
| 2008/0072207 | A1 | 3/2008 | Verma et al. |
| 2008/0081385 | A1 | 4/2008 | Marella et al. |
| 2008/0295047 | A1 | 11/2008 | Nehmadi et al. |
| 2008/0304056 | A1 | 12/2008 | Alles et al. |
| 2009/0016595 | A1 | 1/2009 | Peterson et al. |
| 2009/0024967 | A1 | 1/2009 | Su et al. |
| 2009/0041332 | A1 | 2/2009 | Bhaskar et al. |
| 2009/0055783 | A1 | 2/2009 | Florence et al. |
| 2009/0080759 | A1 | 3/2009 | Bhaskar et al. |
| 2009/0210183 | A1 | 8/2009 | Rajski et al. |

FOREIGN PATENT DOCUMENTS

| | | |
|---|---|---|
| EP | 0370322 | 5/1990 |
| EP | 1061358 | 12/2000 |
| EP | 1061571 | 12/2000 |
| EP | 1065567 | 1/2001 |
| EP | 1066925 | 1/2001 |
| EP | 1069609 | 1/2001 |
| EP | 1093017 | 4/2001 |
| EP | 1480034 | 11/2004 |
| EP | 1696270 | 8/2006 |
| JP | 2002-071575 | 3/2002 |
| JP | 2002-365235 | 12/2002 |
| JP | 2004-045066 | 2/2004 |
| KR | 10-2001-0037026 | 5/2001 |
| KR | 10-2001-0101697 | 11/2001 |
| KR | 1020030055848 | 7/2003 |
| KR | 1020050092053 | 9/2005 |
| KR | 10-2006-0075691 | 7/2006 |
| WO | WO 98/57358 | 12/1998 |
| WO | WO 99/22310 | 5/1999 |
| WO | WO 99/25004 | 5/1999 |
| WO | WO 99/38002 | 7/1999 |
| WO | WO 99/41434 | 8/1999 |
| WO | WO 99/59200 | 11/1999 |
| WO | WO 00/03234 | 1/2000 |
| WO | WO 00/36525 | 6/2000 |
| WO | WO 00/55799 | 9/2000 |
| WO | WO 00/68884 | 11/2000 |
| WO | WO 00/70332 | 11/2000 |
| WO | WO 01/09566 | 2/2001 |
| WO | WO 01/40145 | 6/2001 |
| WO | WO 03/104921 | 12/2003 |
| WO | WO 2004/027684 | 4/2004 |
| WO | WO 2006/063268 | 6/2006 |
| WO | 2010/093733 | 8/2010 |

OTHER PUBLICATIONS

Sato et al, "Defect Criticality Index (DCI): A new methodology to significantly improve DOI sampling rate in a 45nm production environment", Proc. of SPIE, vol. 6922, 692213 (2008), online publication date: Mar. 22, 2008.*

Dirksen et al., "Impact of high order aberrations on the performance of the aberration monitor," Proc. of SPIE vol. 4000, Mar. 2000, pp. 9-17.

Dirksen et al., "Novel aberration monitor for optical lithography," Proc. of SPIE vol. 3679, Jul. 1999, pp. 77-86.

Lo et al., "Identifying Process Window Marginalities of Reticle Designs for 0.15/0.13 µm Technologies," Proceedings of SPIE vol. 5130, 2003, pp. 829-837.

Lorusso et al. "Advanced DFM Appins. Using design-based metrology on CDSEM," SPIE vol. 6152, Mar. 27, 2006.

Mack, "Lithographic Simulation: A Review," Proceedings of SPIE vol. 4440, 2001, pp. 59-72.

Svidenko et al. "Dynamic Defect-Limited Yield Prediction by Criticality Factor," ISSM Paper: YE-O-157, 2007.

Volk et al., "Investigation of Smart Inspection of Critical Layer Reticles using Additional Designer Data to Determine Defect Significance," Proceeings of SPIE vol. 5256, 2003, pp. 489-499.

Allan et al., "Critical Area Extraction for Soft Fault Estimation," IEEE Transactions on Manufacturing, vol. 11, No. 1, Feb. 1998.

Svidenko et al. "Dynamic Defect-Limited Yield Prediction by Criticality Factor," ISSM Paper YE-O-157, 2007.

Barty et al., "Aerial Image Microscopes for the inspection of defects in EUV masks," Proceedings of SPIE, vol. 4889, 2002, pp. 1073-1084.

Budd et al., "A New Mask Evaluation Tool, the Microlithography Simulation Microscope Aerial Image Measurement System," SPIE vol. 2197, 1994, pp. 530-540.

Cai et al., "Enhanced Dispositioning of Reticle Defects Using the Virtual Stepper With Automoated Defect Severity Scoring," Proceedings of the SPIE, vol. 4409, Jan. 2001, pp. 467-478.

Comizzoli, "Uses of Corono Discharges in the Semiconfuctor Industry," J. Electrochem. Soc., 1987, pp. 424-429.

Contactless Electrical Equivalent Oxide Thickness Measurement, IBM Technical Disclosure Bulletin, vol. 29, No. 10, 1987, pp. 4622-4623.

Contactless Photovoltage vs. Bias Method for Determining Flat-Band Voltage, IBM Technical Disclosure Bulletin, vol. 32, vol. 9A, 1990, pp. 14-17.

Cosway et al., "Manufacturing Implementation of Corona Oxide Silicon (COS) Systems for Diffusion Furnace Contamination Monitoring," 1997 IEEE/SEMI Advanced Semiconductor Manufacturing Conference, pp. 98-102.

Diebold et al., "Characterization and prodiuction metrology of thin transistor gate oxide films," Materials Science in Semiconductor Processing 2, 1999, pp. 103-147.

Garcia et al., "New Die to Database Inspection Algorithm for Inspection of 90-nm Node Reticles," Proceedings of SPIE, vol. 5130, 2003, pp. 364-374.

Granik et al., "Sub-resolution process windows and yield estimation technique based on detailed full-chip CD simulation," Mentor Graphics, Sep. 2000, 5 pages.

Hess et al., "A Novel Approach: High Resolution Inspection with Wafer Plane Defect Detection," Proceedings of SPIE-International Society for Optical Engineering; Photomask and Next-Generation Lithography Mask Technology 2008, vol. 7028, 2008.

Huang et al., "Process Window Impact of Progressive Mask Defects, Its Inspection and Disposition Techniques (go/no-go criteria) Via a Lithographic Detector," Proceedings of SPIE-The International Society for Optical Engineering; 25th Annual Bacus Symposium on Photomask Technology 2005, vol. 5992, No. 1, 2005, p. 6.

Hung et al., Metrology Study of Sub 20 Angstrom oxynitride by Corona-Oxide-Silicon (COS) and Conventional C-V Approaches, 2002, Mat. Res. Soc. Symp. Proc., vol. 716, pp. 119-124.

International Search Report and Written Opinion for PCT Appln. No. PCT/US06/61112 dated Sep. 25, 2008.

International Search Report and Written Opinion for PCT Appln. No. PCT/US06/61113 dated Jul. 16, 2008.

International Search Report and Written Opinion for PCT Appln. No. PCT/US08/050397 dated Jul. 11, 2008.

International Search Report and Written Opinion for PCT/US2008/062873 mailed Aug. 12, 2008.

International Search Report for PCT/US2008/62875 mailed Sep. 10, 2008.

International Search Report and Written Opinion for PCT Appln. No. PCT/US2008/063008 dated Aug. 18, 2008.

International Search Report for PCT/US2003/21907 mailed Jun. 7, 2004.

International Search Report for PCT/US2004/040733 mailed Dec. 23, 2005.

Karklin et al., "Automatic Defect Severity Scoring for 193 nm Reticle Defect Inspection," Proceedings of SPIE-The International Society for Optical Engineering, 2001, vol. 4346, No. 2, pp. 898-906.

Lu et al., "Application-of Simulation Based Defect Printability Analysis for Mask Qualification Control," Proceedings of SPIE, vol. 5038, 2003, pp. 33-40.

Martino et al., "Application of the Aerial Image Measurement System (AIMS(TM)) to the Analysis of Binary Mask Imaging and Resolution Enhancement Techniques," SPIE vol. 2197, 1994, pp. 573-584.

Miller, "A New Approach for Measuring Oxide Thickness," Semiconductor International, Jul. 1995, pp. 147-148.

Nagpal et al., "Wafer Plane Inspection for Advanced Reticle Defects," Proceedings of SPIE-The International Society for Optical Engineering; Photomask and Next-Generation Lithography Mask Technology. vol. 7028, 2008.

Numerical Recipes in C. The Art of Scientific Computing, 2nd Ed.,© Cambridge University Press 1988, 1992, p. 683.

Otsu, "A Threshold Selection Method from Gray-Level Histograms," IEEE Transactions on Systems, Man, and Cybernetics, vol. SMC-9, No. 1, Jan. 1979, pp. 62-66.

Pang et al., "Simulation-based Defect Printability Analysis on Alternating Phase Shifting Masks for 193 nm Lithography," Proceedings of SPIE, vol. 4889, 2002, pp. 947-954.

Pettibone et al., "Wafer Printability Simulation Accuracy Based on UV Optical Inspection Images of Reticle Defects," Proceedings of SPIE-The International Society for Optical Engineering 1999 Society of Photo-Optical Instrumentation Engineers, vol. 3677, No. II, 1999, pp. 711-720.

Phan et al., "Comparison of Binary Mask Defect Printability Analysis Using Virtual Stepper System and Aerial Image Microscope System," Proceedings of SPIE-The International Society for Optical Engineering 1999 Society of Photo-Optical Instrumentation Engineers, vol. 3873, 1999, pp. 681-692.

Sahouria et al., "Full-chip Process Simulation for Silicon DRC," Mentor Graphics, Mar. 2000, 6 pages.

Schroder et al., Corono-Oxide-Semiconductor Device Characterization, 1998, Solid-State Electronics, vol. 42, No. 4, pp. 505-512.

Schroder, "Surface voltage and surface photovoltage: history, theory and applications," Measurement Science and Technology, vol. 12, 2001, pp. R16-R31.

Schroder, Contactless Surface Charge Semiconductor Characterization, Apr. 2002, Materials Science and Engineering B, vol. 91-92, pp. 196-228.

Schurz et al., "Simulation Study of Reticle Enhancement Technology Applications for 157 nm Lithography," SPIE vol. 4562, 2002, pp. 902-913.

U.S. Appl. No. 10/677,445 (Homer et al.) entitled Methods for Non-Contacting Differential Voltage Measurements filed on Oct. 2, 2003.

U.S. Appl. No. 11/139,151 (Volk et al.) entitled Methods and Systems for Detecting Changes in Reticle Defectivity Over Time filed on May 27, 2005.

U.S. Appl. No. 60/418,887 (Su et al.) entitled Methods and Systems for Reticles Using Aerial Imaging and Die-To-Database Detection filed on Oct. 15, 2002.

U.S. Appl. No. 60/419,028 (Stokowski et al.) entitled Methods and Systems for Inspecting Reticles Using Aerial Imaging at Off-Stepper Wavelengths filed on Oct. 15, 2002.

U.S. Appl. No. 60/485,233 (Peterson et al.) entitled Qualifying Patterns, Patterning Processes, or Patterning Apparatus in the Fabrication of Microlithographic Patterns filed on Jul. 7, 2003.

U.S. Appl. No. 60/526,881 (Hess et al.) entitled Designer Intent filed on Dec. 4, 2003.

U.S. Appl. No. 60/681,095 (Nehmadi et al.) entitled Methods in Mask and Qualification filed on May 13, 2005.

U.S. Appl. No. 60/684,360 (Nehmadi et al.) entitled Design-Based Inspection filed on May 24, 2005.

Verkuil et al., "A Contactless Alternative to MOS Charge Measurements by Means of a Corona-Oxide-Semiconductor (COS) Technique, "Electrochem. Soc. Extended Abstracts, 1988, vol. 88-1, No. 169, pp. 261-262.

Verkuil, "Rapid Contactless Method for Measuring Fixed Oxide Charge ASsociated with SIlicon Processing;" IBM Technical Disclousre Bulletin, vol. 24, No. 6, 1981, pp. 3048-3053.

Volk et al. "Investigation of Reticle Defect Formation af DUV Lithography," 2002, BACUS Symposium on Photomask Technology.

Volk et al. "Investigation of Reticle Defect Formation at DUV Lithography," 2003, IEEE/SEMI Advanced Manufacturing Conference, pp. 29-35.

Weinberg, "Tunneling of Electrons from Si into Thermally-Grown $SiO_2$," Solid-State Electronics, 1977, vol. 20, pp. 11-18.

Weinzierl et al., "Non-Contact Corona-Based Process Control Measurements: Where We've Been, Where We're Headed," Electrochemical Society Proceedings, Oct. 1999, vol. 99-16, pp. 342-350.

Yan et al., "Printability of Pellicle Defects in DUV 0.5 μm Lithography," SPIE vol. 1604, 1991, pp. 106-117.

International Search Report for PCT/US2008/070647 mailed Dec. 16, 2008.

International Search Report and Written Opinion for PCT/US2008/073706 mailed Jan. 29, 2009.

International Search Report and Written Opinion for PCT/US2008/072636 mailed Jan. 29, 2009.

International Search Report & Written Opinion, PCT/US2008/066328, mailed Oct. 1, 2009.

O'Gorman et al., "Subpixel Registration Using a Concentric Ring Fiducial," Proceedings of the International Conference on Pattern Recognition, vol. ii, Jun. 16, 1990, pp. 249-253.

International Search Report and Written Opinion, PCT/US2009/039936, mailed Nov. 25, 2009.

International Preliminary Report on Patentability for PCT/US2009/039936 mailed Oct. 28, 2010.

Tang et al., "Analyzing Volume Diagnosis Results with Statistical Learning for Yield Improvement" 12th IEEE European Test Symposium, Freiburg 2007, IEEE European, May 20-24, 2007, pp. 145-150.

U.S. Appl. No. 60/418,994 filed Oct. 15, 2002 by Stokowski et al.

U.S. Appl. No. 60/451,707 filed Mar. 4, 2003 by Howard et al.

U.S. Appl. No. 60/609,670 filed Sep. 14, 2004 by Preil et al.

U.S. Appl. No. 60/738,290 filed Nov. 18, 2005 by Kulkarni et al.

U.S. Appl. No. 60/772,418 filed Feb. 9, 2006 by Kirk et al.

U.S. Appl. No. 10/778,752 filed Feb. 13, 2004 by Preil et al.

U.S. Appl. No. 10/793,599 filed Mar. 4, 2004 by Howard et al.

U.S. Appl. No. 11/154,310 filed Feb. 10, 2005 by Verma et al.

* cited by examiner

METHODS AND SYSTEMS FOR DETERMINING A DEFECT CRITICALITY INDEX FOR DEFECTS ON WAFERS

BACKGROUND OF THE INVENTION

1. Field of the Invention

The present invention generally relates to methods and systems for determining a defect criticality index (DCI) for defects on wafers. Certain embodiments relate to a computer-implemented method that includes determining a DCI for a defect detected on a wafer based on critical area information for a portion of a design for the wafer surrounding the defect, a location of the defect with respect to the critical area information, and the reported size of the defect.

2. Description of the Related Art

The following description and examples are not admitted to be prior art by virtue of their inclusion in this section.

An integrated circuit (IC) design may be developed using a method or system such as electronic design automation (EDA), computer aided design (CAD), and other IC design software. Such methods and systems may be used to generate a circuit pattern database from the IC design. The circuit pattern database includes data representing a plurality of layouts for various layers of the IC. Data in the circuit pattern database may be used to determine layouts for a plurality of reticles. A layout of a reticle generally includes a plurality of polygons that define features in a pattern on the reticle. Each reticle is used to fabricate one of the various layers of the IC. The layers of the IC may include, for example, a junction pattern in a semiconductor substrate, a gate dielectric pattern, a gate electrode pattern, a contact pattern in an interlevel dielectric, and an interconnect pattern on a metallization layer.

A semiconductor device design is verified by different procedures before production of ICs. For example, the semiconductor device design is checked by software simulation to verify that all features will be printed correctly after lithography in manufacturing. Such checking commonly includes steps such as design rule checking (DRC), optical rule checking (ORC), and more sophisticated software-based verification approaches that include process simulation calibrated to a specific fab and process. The output of the physical design verification steps can be used to identify a potentially large number of critical points, sometimes referred to as "hot spots," in the design.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary since even relatively small defects may cause unwanted aberrations in the semiconductor devices.

As design rules shrink, however, semiconductor manufacturing processes may be operating closer to the limitations on the performance capability of the processes. In addition, smaller defects can have an impact on the electrical parameters of the device as the design rules shrink, which drives more sensitive inspections. Therefore, as design rules shrink, the population of potentially yield relevant defects detected by inspection grows dramatically, and the population of nuisance defects detected by inspection also increases dramatically. Therefore, more and more defects may be detected on wafers, and correcting the processes to eliminate all of the defects may be difficult and expensive. As such, determining which of the defects actually have an effect on the electrical parameters of the devices and the yield may allow process control methods to be focused on those defects while largely ignoring others. Furthermore, at smaller design rules, process-induced failures may, in some cases, tend to be systematic. That is, process-induced failures tend to fail at predetermined design patterns often repeated many times within the design. Elimination of spatially systematic, electrically relevant defects is important because eliminating such defects can have a significant overall impact on yield.

Accordingly, it would be advantageous to develop methods and systems for substantially accurate and real time determination of criticality of defects detected on wafers such that functions performed using results of inspection can be focused on the defects that are critical while largely ignoring those that are not.

SUMMARY OF THE INVENTION

The following description of various embodiments of methods, computer-readable mediums, and systems is not to be construed in any way as limiting the subject matter of the appended claims.

One embodiment relates to a computer-implemented method for determining a defect criticality index (DCI) for defects on wafers. The method includes determining critical area information for a portion of a design for a wafer surrounding a defect detected on the wafer by an inspection system based on a location of the defect reported by the inspection system and a size of the defect reported by the inspection system. The method also includes determining a DCI for the defect based on the critical area information, a location of the defect with respect to the critical area information, and the reported size of the defect.

In one embodiment, determining the DCI is performed during inspection of the wafer by the inspection system. In another embodiment, the method includes determining DCIs for multiple defects detected on the wafer and filtering the multiple defects having the DCIs below a predetermined threshold. In an additional embodiment, the method includes determining DCIs for multiple defects detected on the wafer and filtering the multiple defects having the DCIs below a predetermined threshold from results of inspection as the inspection of the wafer is being performed by the inspection system. In a further embodiment, the method includes determining DCIs for multiple defects detected on the wafer, ranking the multiple defects based on the DCIs, and performing one or more functions on the multiple defects based on the ranking.

In one embodiment, the critical area information includes a local critical area map. In another embodiment, the critical area information includes critical area information for multiple types of fault mechanisms. In an additional embodiment, the location of the defect with respect to the critical area information includes a location of the defect within a critical area map.

In one embodiment, the critical area information is extracted from design data for the wafer. In another embodiment, the method includes determining the location of the defect with respect to the critical area information by aligning an image of the defect to a critical area map to determine a location of the defect in the design. In an additional embodiment, the method includes determining a location of the defect in the design by aligning an image of the defect to a design clip.

In one embodiment, the method includes creating a critical radius map prior to inspection of the wafer from design data for the wafer, and the critical radius map is a critical area map in which each value in the critical area map is a radius of the size of the defect that can cause a fault in the design. In one such embodiment, the method includes during inspection of the wafer, sending a portion of the critical radius map corresponding to an area of the wafer being inspected to one or more image processors of the inspection system. In another such embodiment, determining the critical area information includes when the defect is detected, extracting a local area of the critical radius map and creating a local critical area map by thresholding the critical radius map with the reported size of the defect. In an additional such embodiment, the critical radius map does not include the design data.

In one embodiment, determining the critical area information includes when a defect is detected, extracting a design clip having a window size centered at the reported location of the defect, where the window size is greater than the sum of the uncertainty of the reported location of the defect and the uncertainty of the reported size of the defect, and determining the critical area information from polygons in the design clip. In one such embodiment, determining the DCI includes applying a probability distribution function to the critical area information and summing the probability. In one such embodiment, the probability distribution function reflects the uncertainty of the reported location of the defect and the uncertainty of the reported size of the defect.

Each of the steps of each of the embodiments of the method described above may be further performed as described herein. In addition, each of the embodiments of the method described above may include any other step(s) of any other method(s) described herein. Furthermore, each of the embodiments of the method described above may be performed by any of the systems described herein.

Another embodiment relates to a computer-readable medium that includes program instructions executable on a computer system for performing a computer-implemented method for determining a DCI for defects on wafers. The computer-implemented method includes determining critical area information for a portion of a design for a wafer surrounding a defect detected on the wafer by an inspection system based on a location of the defect reported by the inspection system and a size of the defect reported by the inspection system. The method also includes determining a DCI for the defect based on the critical area information, a location of the defect with respect to the critical area information, and the reported size of the defect.

The computer-readable medium described above may be further configured according to any of the embodiment(s) described herein. Each of the steps of the computer-implemented method executable by the program instructions may be further performed as described herein. In addition, the computer-implemented method executable by the program instructions may include any other step(s) of any other method(s) described herein.

An additional embodiment relates to a system configured to determine a DCI for defects on wafers. The system includes an inspection subsystem configured to detect a defect on a wafer and to report a location of the defect and a size of the defect. The system also includes a computer subsystem configured to determine critical area information for a portion of a design for the wafer surrounding the defect based on the reported location and the reported size of the defect. The computer subsystem is also configured to determine a DCI for the defect based on the critical area information, a location of the defect with respect to the critical area information, and the reported size of the defect.

The embodiment of the system described above may be further configured according to any other embodiment(s) described herein. In addition, the embodiment of the system described above may be configured to perform any step(s) of any method embodiment(s) described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which.

Figure 1:
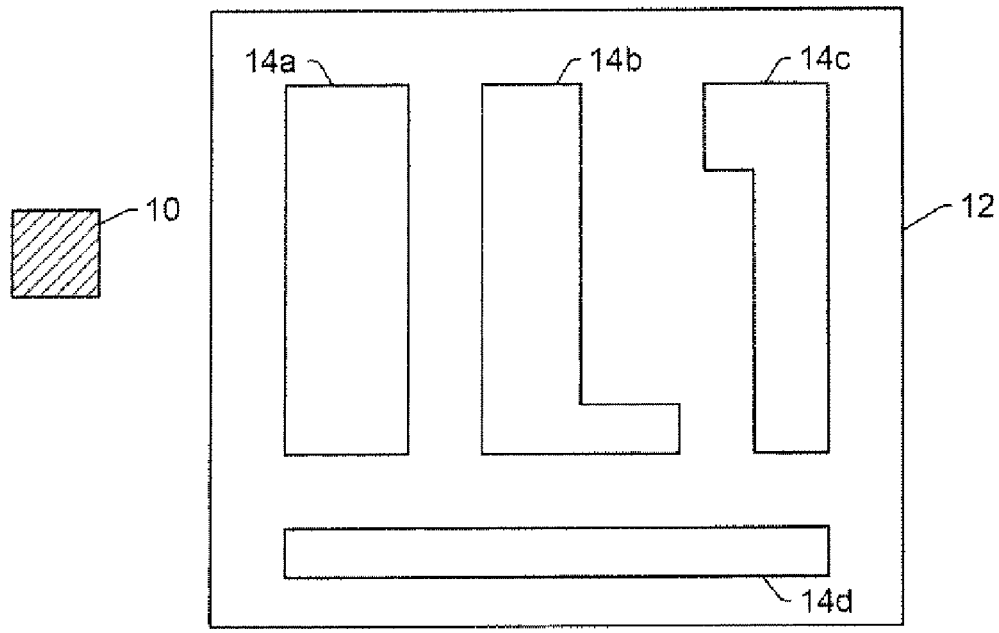
FIG. 1 is a schematic diagram illustrating a plan view of an example of a given defect and a design clip, which may be extracted for the defect according to an embodiment described herein.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

A wafer may include one or more layers formed upon a substrate. For example, such layers may include, but are not limited to, a resist, a dielectric material, a conductive material, and a semiconductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features. Formation and processing of such layers of material may ultimately result in completed devices. Many different types of devices such as integrated circuits (ICs) may be formed on a wafer, and the term wafer as used herein is intended to encompass a wafer on which any type of device known in the art is being fabricated.

Although embodiments are described herein with respect to wafers, it is to be understood that the embodiments may be used for another specimen such as a reticle, which may also be commonly referred to as a mask or a photomask. Many different types of reticles are known in the art, and the terms "reticle," "mask," and "photomask" as used herein are intended to encompass all types of reticles known in the art.

The term "design" as used herein generally refers to the physical design (layout) of an IC and data derived from the physical design through complex simulation or simple geometric and Boolean operations. The design may include not only layout information, but electrical and material design information as well. Basically, the design may include any design information that is used in the creation of a "device." In addition, an image of a reticle acquired by a reticle inspection system and/or derivatives thereof can be used as a "proxy" or "proxies" for the design. Such a reticle image or a derivative thereof can serve as a substitute for the design in any embodiments described herein that use a design. The design may include any other design data or design data proxies described in commonly owned U.S. patent application Ser. No. 11/561,735 by Kulkarni et al., published as U.S. Patent Application Publication No. 2007/0156379 on Jul. 5, 2007, and Ser. No. 11/561,659 by Zafar et al., published as U.S. Patent Application Publication No. 2007/0288219 on Dec. 13, 2007, both of which were filed on Nov. 20, 2006 and which are incorporated by reference as if fully set forth herein.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

In the past, wafer inspection tools only use images acquired from the wafer to make decisions, e.g., automatic defect classification (ADC) or nuisance filtering, about the detected defects. Due to the limitations of image resolution, the underlying circuit patterns where the defects occur are usually not resolved and therefore the decision made about each defect has a significant amount of ambiguity. The industry has only recently begun to look for ways to improve inspection results by utilizing the design of the wafer.

One example of this trend is design-based binning (DBB), which is described in the above-referenced patent applications by Kulkarni et al. and Zafar et al. As described in those patent applications, defects may essentially be grouped or classified based on the design pattern at the defect location. In addition, the systems and methods described in those patent applications may assign a criticality index to each defect by checking several design attributes such as pattern density, pattern pitch, and defect size. In such systems and methods, the defect criticality value is essentially an estimation of fault probability based on design attributes determined from a design clip of the defect location. However, because the design clip has to be big enough to cover the uncertainty of the defect location, the accuracy of the criticality value is reduced by the location uncertainty.

In general, the embodiments described herein relate to methods and systems for substantially accurate and real time determination of criticality of defects detected on wafers such that functions performed using results of inspection can be focused on defects that are critical while largely ignoring those that are not. For example, one embodiment relates to a computer-implemented method for determining a defect criticality index (DCI) for defects on wafers. The embodiments described herein improve upon other methods for determining defect criticality values in a number of respects which are described further herein.

The defects for which a DCI is determined as described herein may include any defects that are detected on any wafers (e.g., patterned wafers). The defects may be detected on the wafer in any suitable manner using any suitable inspection system. Examples of suitable inspection systems for inspecting wafers to thereby detect defects on wafers include commercially available inspection systems such as the 2360, 2365, 2371, and 23xx systems and the Pima 90xx and 91xx series tools, which are commercially available from KLA-Tencor, San Jose, Calif. In addition, the inspection system may be an inspection system configured for dark field (DF) inspection of a wafer and/or bright field (BF) inspection of a wafer. Furthermore, the inspection system may be configured for patterned wafer and/or unpatterned wafer inspection. Moreover, an existing inspection system may be modified (e.g., a computer subsystem of the inspection system may be modified) such that the existing inspection system can perform one or more embodiments of the computer-implemented methods described herein.

In one embodiment, determining the DCI is performed during inspection of the wafer by the inspection system. In this manner, the method may be used for substantially accurate and real time computation of DCI, which may be performed as described further herein based on critical area analysis (CAA) for semiconductor wafers. In addition, the computer-implemented method for determining the DCI may be performed by an inspection system used to detect the defects. In this manner, the method may be performed on-tool.

The method includes determining critical area information for a portion of a design for a wafer surrounding a defect detected on the wafer by an inspection system based on a location of the defect reported by the inspection system and a size of the defect reported by the inspection system. The critical area information may be determined according to any embodiments described herein for one, some, or all of the defects detected on the wafer. In addition, as described further herein, the critical area information may be determined for each defect separately (e.g., the critical area information is determined for one defect, the critical information is separately determined for a different defect, and so on). The location and size of the defect reported by the inspection system may be acquired by the computer-implemented method in any suitable manner.

In one embodiment, the critical area information includes a local critical area map. The local critical area map can be created in a number of different ways. For example, a local critical area map can be created from a critical radius map as described herein. In addition, a local critical area map can be created from local design information (e.g., a design clip) corresponding to a defect location, which may be performed as described herein. A local critical area map is different than a critical area map in that the local critical area map corresponds to only a portion of the design for the wafer while a critical area map corresponds to the entire design for the wafer.

In one embodiment, the method includes creating a critical radius map prior to inspection of the wafer from design data for the wafer. The critical radius map is a critical area map in which each value in the critical area map is a radius of the size of the defect that can cause a fault in the design. For example, in a real time implementation of the method, the design data can be pre-processed to create a critical radius map, i.e., a three-dimensional (3D) version of a critical area map in which each value in the map indicates the radius of the defect size that can cause a fault in the design. In this manner, the embodiments described herein are advantageous in that the method may include pre-processing the design to create the critical radius map. Therefore, the method can be performed in real time with substantially little impact on the inspection speed. Creating the critical radius map from the design data may be performed using any suitable method or system. For example, one efficient method for creating a critical radius map is described in commonly owned U.S. Pat. No. 6,918, 101 to Satya et al., which is incorporated by reference as if fully set forth herein. The embodiments described herein may include any step(s) of any method(s) described in this patent.

The method may include pre-processing the design data to create the critical radius map for the purpose of feeding the map to defect inspection in real time. For example, in one embodiment, the method includes during the inspection of the wafer, sending a portion of the critical radius map corresponding to an area of the wafer being inspected to one or more image processors of the inspection system. In this manner, during inspection, the area of the critical radius map that registers with the area being inspected may be sent to the image processor(s) that perform defect detection. The critical radius map will in general be substantially large in terms of data size. However, one suitable mechanism for storing and retrieving the critical radius map that can be used in embodiments described herein to facilitate real time usage of the critical radius map is described in the above-referenced patent applications by Kulkarni et al. and Zafar et al. with respect to storage and retrieval of context maps. The embodiments described herein may include any step(s) of any method(s) described in these patent applications.

In some embodiments, determining the critical area information includes when the defect is detected, extracting a local area of the critical radius map and creating a local critical area map by thresholding the critical radius map with the reported size of the defect. In this manner, the method may include determining a critical area map given a defect size. For example, when a defect is detected, the local area of the critical radius map (in the extent of the reported defect location uncertainty) may be extracted, and a local critical area map may be constructed by thresholding the critical radius map with the defect size. In particular, the critical radius map may include the minimum defect size that can cause a fault such as a short or open at different locations in the map. In this manner, the values in the critical radius map can be compared to the defect size by thresholding, and based on the results of the thresholding, the critical areas for that defect having that size can be determined and used to create the local critical area map for that defect. The method may, therefore, include determining the critical area map from a clip of the critical radius map given a reported defect size and location. As such, the embodiments described herein provide an efficient method for computing the critical area map given a defect size. However, the critical radius map may be used in any other suitable manner to determine the critical area information. In other words, the embodiments described herein are not limited to determining critical area information based on a critical radius map in only the manner described herein.

In an additional such embodiment, the critical radius map does not include the design data. In this manner, the created critical radius map may not contain the original design for the wafer. Therefore, a recipe for determining DCI that includes such a critical radius map can be portable without any intellectual property issues related to sharing of the device design.

In one embodiment, the critical area information is extracted from design data for the wafer. In this manner, the embodiments described herein can optimize the inspection of a semiconductor patterned wafer by fully integrating the critical area information extracted from design data for the wafer into the flow of inspection. The critical area information may be extracted from the design as described further herein.

In one embodiment, determining the critical area information includes when a defect is detected, extracting a design clip having a window size centered at the reported location of the defect. The window size is greater than the sum of the uncertainty of the reported location of the defect and the uncertainty of the reported size of the defect. Determining the critical area information also includes determining the critical area information from polygons in the design clip. In this manner, the method may include "on-demand" computation of a local critical area map given a defect location and defect size. In other words, in this embodiment, the critical area information may not be determined until it is needed (e.g., when a defect is detected on the wafer). As such, the embodiments described herein provide an efficient method for computing the critical area map given a defect size.

For example, given a defect such as defect 10 shown in FIG. 1, the method may include extracting design clip 12 having a window size centered at the defect location. The window size is greater than the sum of the location uncertainty and the defect size to guarantee that the actual defect location is within the window. As shown in FIG. 1, the design clip includes polygons 14a, 14b, 14c, and 14d. The polygons shown in design clip 12 are arbitrarily selected, non-limiting examples of polygons meant to illustrate steps that may be performed by the embodiments described herein. In other words, the polygons shown in FIG. 1 (and FIGS. 2-4) are not meant to illustrate any polygons that may actually be included in a design or design clip or any characteristics of polygons that may be included in a design or design clip. Obviously, the polygons included in the design clip will vary depending on the actual design for the wafer. In addition, defect 10 shown in FIG. 1 is an arbitrarily selected, non-limiting example of a defect for which the embodiments described herein may be performed. In other words, the defect shown in FIG. 1 is not meant to illustrate any defect that may actually be detected on a wafer or any characteristics of defects that may be detected on a wafer for which the embodiments described herein may be performed.

To determine the critical areas of short faults, the method may process each pair of opposing edges of two polygons. If the gap between the two edges is smaller than the defect size, a critical area for short will be generated, as shown in FIG. 2.

Figure 2:
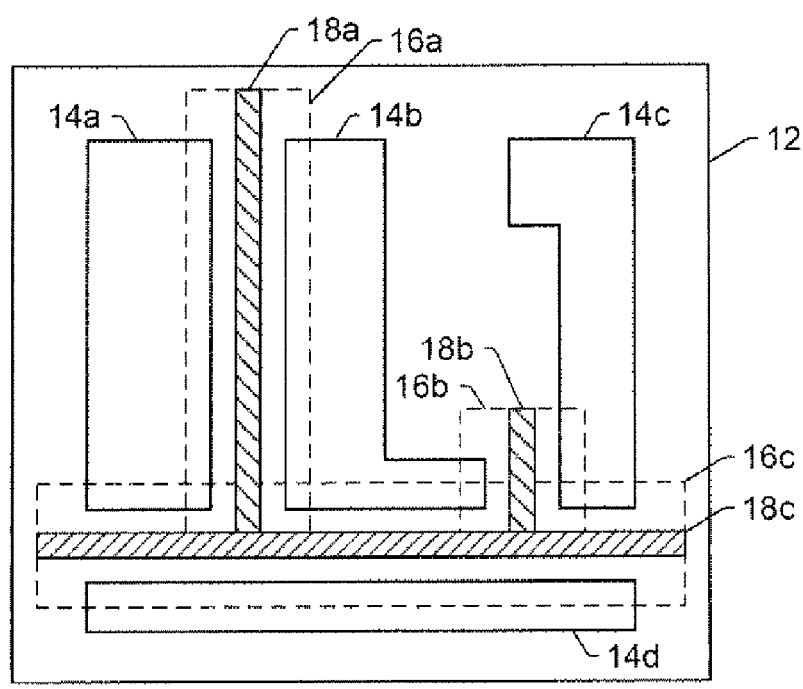
FIG. 2 is a schematic diagram illustrating a plan view of the design clip of FIG. 1 with critical areas for short, which may be generated according to an embodiment described herein.

For example, as shown in FIG. 2, area 16a that includes the pair of opposing edges of polygons 14a and 14b was processed for a particular defect size, and the processing of the pair of opposing edges produces critical area 18a shown in FIG. 2. Critical area 18a is the area in which if a defect having the particular defect size is located, the defect will cause a short between polygons 14a and 14b. In a similar manner, area 16b that includes the pair of opposing edges of polygons 14b and 14c was processed for a particular defect size, and the processing of the pair of opposing edges produces critical area 18b shown in FIG. 2. Critical area 18b is the area in which if a defect having the particular defect size is located, the defect will cause a short between polygons 14b and 14c. Furthermore, area 16c that includes the pairs of opposing edges between polygon 14d and polygons 14a, 14b, and 14c was processed for a particular defect size, and the processing of the pairs of opposing edges produces critical area 18c shown in FIG. 2. Critical area 18c is the area in which if a defect having the particular defect size is located, the defect will cause a short between polygon 14d and at least one of polygons 14a, 14b, and 14c. In this manner, FIG. 2 shows the critical areas for short that may be determined for the design clip.

Figure 3:
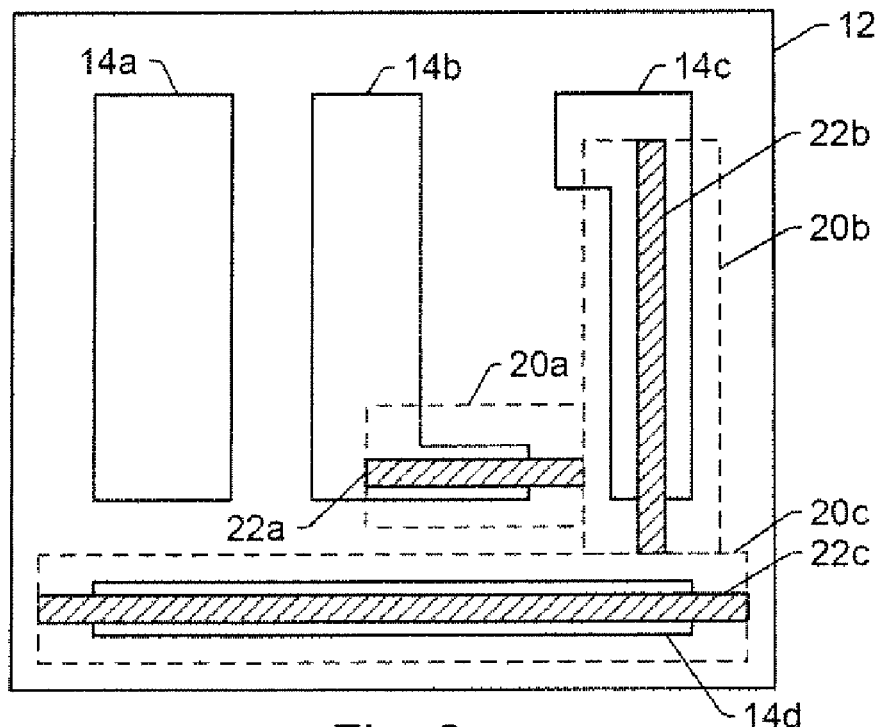
FIG. 3 is a schematic diagram illustrating a plan view of the design clip of FIG. 1 with critical areas for open, which may be generated according to an embodiment described herein.

Similarly, to compute the critical area of open fault, the method may process each pair of opposing edges of each same polygon. If the distance of such an edge pair is smaller than the defect size, then a critical area for open is created, as shown in FIG. 3. For example, as shown in FIG. 3, area 20a that includes a pair of opposing edges of polygon 14b was processed for a particular defect size, and the processing of the pair of opposing edges produces critical area 22a shown in FIG. 3. Critical area 22a is the area in which if a defect having the particular defect size is located, the defect will cause an open in the portion of polygon 14b included in area 20a. In a similar manner, area 20b that includes a pair of opposing edges of polygon 14c was processed for a particular defect size, and the processing of the pair of opposing edges produces critical area 22b shown in FIG. 3. Critical area 22b is the area in which if a defect having the particular defect size is located, the defect will cause an open in the portion of polygon 14c included in area 20b. Furthermore, area 20c that includes a pair of opposing edges of polygon 14d was processed for a particular defect size, and the processing of the pair of opposing edges produces critical area 22c shown in FIG. 3. Critical area 22c is the area in which if a defect having the particular defect size is located, the defect will cause an open in polygon 14d. In this manner, FIG. 3 shows the critical areas for open that may be determined for the design clip.

Figure 4:
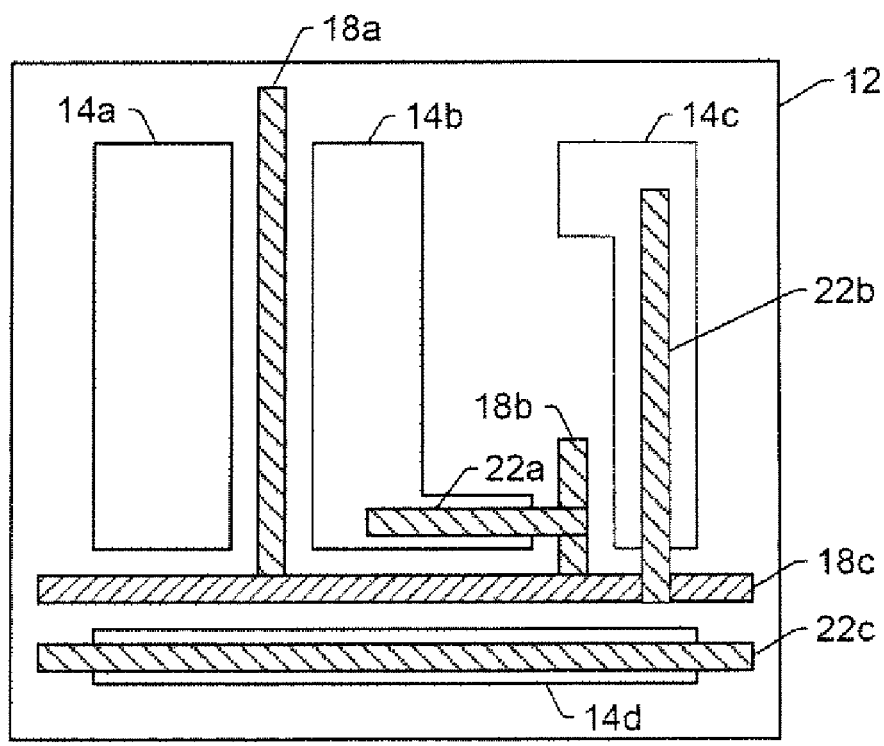
FIG. 4 is a schematic diagram illustrating a plan view of the design clip of FIG. 1 with the union of the critical areas for short shown in FIG. 2 and the critical areas for open shown in FIG. 3, which may be generated according to an embodiment described herein.

In some embodiments, the critical area information includes critical area information for multiple types of fault mechanisms. For example, the union of all of the critical areas shown in FIGS. 2 and 3 produces the final critical areas, as shown in FIG. 4. In this manner, FIG. 4 shows the total critical areas for the design clip. Those critical areas can then be used in additional steps described herein. For example, the final critical areas shown in FIG. 4 can be used as a critical area map. In this manner, the method may include computing the critical area map from a design clip for a given defect size.

CAA may also be performed in a number of other ways. For example, the critical area information may be determined in the embodiments described herein as described in commonly owned U.S. Pat. No. 6,813,572 to Satya et al., which is incorporated by reference as if fully set forth herein. The critical area information may also be determined for semiconductor design data as described in commonly owned U.S. Pat. No. 6,751,519 to Satya et al. and U.S. Pat. No. 6,948,141 to Satya et al., which are incorporated by reference as if fully set forth herein. The embodiments described herein may include any step(s) described in these patents.

The method also includes determining a DCI for the defect based on the critical area information, a location of the defect with respect to the critical area information, and the reported size of the defect. For example, the method may include determining DCI based on CAA of the design clip of a defect, which may be performed as described herein. In addition, the method may include determining the DCI from the local critical area map, which may be created as described herein. In this manner, the DCI is based on CAA thereby providing DCIs that are more accurate than those provided by other methods and systems and that are more likely to correlate to yield impact of the defects. As such, the DCI can be used as an indicator of yield relevance of the defect. For example, determining the DCI based on the critical area information essentially determines the DCI based on sensitivity of yield of the design to defects. In this manner, the DCI is essentially determined based on sensitivity of yield impact within a region in the design. For example, as described further herein, the method may include determining the location of the defect in the design, and the yield sensitivity due to the defect at this location may be determined based on the critical area information. In this manner, the location of a defect in the design may be used to determine the yield sensitivity of the design to the defect. If the yield sensitivity of the design to the defect is relatively high, then the DCI for the defect may be higher than would be the case if the yield sensitivity of the design to the defect is relatively low.

In one embodiment, the location of the defect with respect to the critical area information includes a location of the defect within a critical area map. For example, in one embodiment, the critical area information includes a critical area map, and for each detected defect, the method includes determining a DCI based on the defect size and where the defect lands in the critical area map. In one such embodiment, determining the DCI may include determining the critical area in the design based on the defect size and then using the local critical area map to estimate the DCI of the defect. For example, the local critical area map may be constructed as described above, and then the DCI can be computed from the local critical area map. Since the critical area is substantially precise and as described above can account for different types of fault mechanisms such as opens and shorts, the determined DCI is much more accurate than that determined by other methods.

In some embodiments, the method includes determining the location of the defect with respect to the critical area information by aligning an image of the defect to a critical area map to determine a location of the defect in the design. The image of the defect may include an image of the defect acquired during inspection (e.g., an optical patch image). For example, when there is ambiguity in the criticality due to the uncertainty of the defect location, the method may include aligning the defect image to the critical area map to resolve the location. In one such example, the defect image may be aligned to the design or a design clip thereby aligning the defect image to the critical area map since the critical area map is determined as a function of the design. Since the defect is always centered in the defect image, once the alignment is achieved, the precise location of the defect in the design can be determined. In this manner, the embodiments described herein are advantageous in that the uncertainty of the DCI can be reduced by resolving the location uncertainty of the defect.

In one embodiment, the method includes determining a location of the defect in the design by aligning an image of the defect to a design clip. The image of the defect may include an image of the defect acquired during inspection (e.g., an optical patch image). For example, determining a substantially precise defect location in the design may include aligning the defect image to the design clip. In one such example, a suitable Canny edge operator, which may include any suitable Canny edge operator known in the art, may be applied to the design clip to extract edges from the design clip. Another suitable Canny edge operator may be applied to extract edges from the reference image of the defect. A Hough transform, which may include any suitable Hough transform known in the art, may be used to find the best match between the two sets of edges. The coordinate offset may then be calculated based on the matched edges. In this manner, the method may include using the defect image for resolving the location uncertainty of a defect with respect to the design clip. As such, image-based analysis can be integrated with design-based analysis such as that described herein to improve the accuracy of DCI.

In one embodiment, determining the DCI includes applying a probability distribution function to the critical area information and summing the probability. For example, to compute the DCI of a defect, the method may apply a probability distribution function to the critical area map and sum up the probability. In this manner, the method may include calculating the DCI from the local critical area map and a probability distribution function of defect location. In one such embodiment, the probability distribution function reflects the uncertainty of the reported location of the defect and the uncertainty of the reported size of the defect. For example, to achieve the best estimation, the probability distribution function should reflect the defect location uncertainty and the defect size uncertainty of the inspection system. In addition, the probability distribution function may be optimized to reflect the location uncertainty of the inspection system. The probability distribution function may include any suitable function such as a Gaussian function. As such, the method may include calculating the DCI from the critical area map for a given defect location uncertainty.

As described above, the method includes determining a DCI for the defect based on the critical area information, a location of the defect with respect to the critical area information, and the reported size of the defect. In addition, as described above, the method may include determining the DCI in real time during inspection of a wafer. Furthermore, as described above, the method is substantially efficient for real time DCI determination, for example, since the critical radius map can be created before inspection of the wafer and used during inspection. However, there are additional ways to improve the efficiency of the methods for real time DCI determination. For example, in alternative embodiments, the method may include creating a DCI map and using the DCI map to determine the DCI in real time. For example, the DCI map may be similar to the critical radius map described above except that in the DCI map each value in the map may indicate the radius of the defect size that has a certain value of the DCI (e.g., a DCI value corresponding to a radius of the defect size that can cause a fault in the design or a DCI value that does not correspond to a radius of the defect size that can cause a fault in the design). In this manner, the DCI map may be used to essentially look up the DCI for a defect based on the location of the defect with respect to the DCI map and the reported size of the defect. As such, the DCI map may be pre-calculated and used to accelerate the real time DCI calculations. In addition, the critical radius map can be used to create the DCI map, e.g., by translating the values in the critical radius map that indicate the radius of the defect size that can cause a fault in the design to values in the DCI map that indicate the radius of the defect that corresponds to certain DCI values. Furthermore, the design may be pre-processed (i.e., processed before inspection) to create the DCI map, which can then be integrated into the flow of defect detection thus achieving real time processing.

The DCI may have any suitable format (numeric, alphanumeric, text string, etc.). The DCI may be expressed in a manner such that a user can easily understand the value of the DCI. For example, the DCI may be assigned a value between 1 and 10, with 10 being the highest DCI and 1 being the lowest DCI. The DCI may also or alternatively be expressed in a manner such that a method or system such as one or more of the embodiments described herein may utilize the DCI to perform one or more of the steps described herein.

In one embodiment, the defect for which the DCI is determined includes a random defect. In another embodiment, the defect for which the DCI is determined includes a systematic defect. In this manner, the DCI may be determined for both random and systematic defects. In addition, the method may include performing design-based grouping (DBG) to identify the systematic defects on the wafer, and then DCIs may be determined for the remaining, ungrouped defects, which may include mostly random defects. Alternatively, the method may include determining DCIs for all of the detected defects, and then DBG may be performed for defects determined to have relatively high DCIs. Determining if a defect is a random defect or a systematic defect and DBG may be performed as described in the above-referenced patent applications by Kulkarni et al. and Zafar et al.

Although the embodiments of the method are described above as including determining a DCI for a defect, it is to be understood that the method may include determining DCIs for one defect, some defects, or all defects detected on a wafer. The defect(s) for which DCI(s) are determined in the method may be selected by a user. Alternatively, the defect(s) for which DCI(s) are determined in the method may be selected by the method (e.g., based on one or more attributes of the defect(s), one or more attributes of the design at the position(s) of the defect(s) in design data space, any other information about the defect(s) and/or the design, or some combination thereof).

As described above, the DCI for a defect is determined based on critical area information, a location of the defect with respect to the critical area information, and the reported size of the defect. However, the DCI for a defect may be determined based on the critical area information, the location of the defect with respect to the critical area information, the reported size of the defect, and any other information about the design that is available at the time of inspection or at the time the DCI is determined. For example, additional information about the design that may be used to determine the DCI includes information about additional layers of the design (e.g., layers other than the layer on which the defect was detected). In this manner, DCI can be calculated based on the current design (GDS) layer, future design (GDS) layers (e.g., layers not yet formed on the wafer), any other design layers, or some combination thereof. For example, the critical area information for a layer other than the layer on which the defect was detected may be determined or identified by determining the location of the defect with respect to the design based on the location of the defect reported by the inspection system. Determining the location of the defect with respect to the design may be performed as described herein. Once the location of the defect with respect to the design is determined, portions of the design on multiple layers corresponding to the location of the defect with respect to the design can be determined (e.g., based on the spatial relationship of the multiple layers with respect to each other). The critical area information corresponding to those portions of the design on other layers can then be determined as described herein. That critical area information for one or more other layers of the design can then be used to determine the DCI in the same manner that the critical area information described herein (for the layer on which the defect was detected) is used to determine the DCI.

Determining the DCI using information about various layers of the design may be advantageous because a defect may be critical with respect to some layers of the design but not others. For example, the defect may affect one or more layers of the design by being propagated through the device and since devices formed on wafers are typically formed of many layers. Therefore, a defect may alter the design printed on more than one layer of the device, and the alterations to any, some, or all of the layers may alter one or more electrical attributes of the device. As such, by using information about more than one layer of the design to determine the DCI, the DCI may be determined based on how the defect may affect more than one layer of the device thereby making the DCI more indicative of potential parametric issues and more yield relevant. In this manner, the DCI may be determined as described herein to reflect such layer-dependent criticality of defects.

The additional information about the design that is used to determine DCI may also include information associated with and/or determined for the design. For example, such additional information may include hot spot areas in the design such as optical proximity correction (OPC) hot spot information (e.g., verification output), lithography hot spot information (e.g., process window qualification (PWQ) output), and electrical hot spot information (e.g., electrical test output). In one such example, if a location of a defect is relatively close to one of the hot spots described above, the DCI value determined for the defect could be higher than for a defect that is not located relatively close to one of the hot spots described above. The location of the defect with respect to the hot spot areas in the design can be determined as described further herein. For example, the location of the defect with respect to the design may be determined based on the location of the defect reported by the inspection system. The location of the defect with respect to the design can then be compared to the locations of the hot spot areas in the design to determine if any of the hot spot areas are relatively close to the location of the defect. The additional information may also include any other information about the design described in the patent applications by Kulkarni et al. and Zafar et al. referenced above (e.g., one or more attributes of the design).

The method may include using the computed DCI values for filtering purposes. For example, in one embodiment, the method includes determining DCIs for multiple defects detected on the wafer and filtering the multiple defects having the DCIs below a predetermined threshold. In this manner, relatively low criticality defects can be filtered out for efficiency. In some embodiments, the method includes determining DCIs for multiple defects detected on the wafer and filtering the multiple defects having the DCIs below a predetermined threshold from results of inspection as the inspection of the wafer is being performed by the inspection system. In this manner, the method may include filtering out defects of relatively low criticality in real time in the image processor(s) of the inspection system.

In some embodiments, the method includes determining DCIs for multiple defects detected on the wafer, ranking the multiple defects based on the DCIs, and performing one or more functions on the multiple defects based on the ranking. For example, the defects can be ranked by criticality for sampling purposes or for statistical process control (SPC) purposes. In one such example, the defects may be sampled based on the ranking by criticality for defect review (e.g., scanning electron microscope (SEM) review sampling), defect metrology (e.g., SEM measurement sampling), or defect analysis (e.g., energy dispersive x-ray (EDX) defect analysis sampling). If the multiple defects are filtered as described above, ranking the multiple defects based on the DCIs may be performed before or after the filtering. In addition, if the multiple defects are filtered as described above, regardless of when ranking is performed, the one or more functions may be performed on only the defects that remain after filtering. For example, relatively low criticality defects can be filtered out for efficiency as described above, and the rest of the defects can be ranked as described above and then sampled, used for SPC, or any other functions described herein. In one such example, the determined DCIs for the defects may be used to determine which of the defects are most critical as described herein, and the most critical defects may be selected for review. Results of selecting the defects for review may include locations of the selected defects on the wafer and any other results of any of the step(s) of the method (s) described herein.

For sampling, in which defects are selected for review, sampling may be performed after the defects have been classified, binned, or grouped. The defects may be classified, binned, or grouped in any suitable manner. Then for each classification, bin, or group of defects, DCI may be used for sampling the defects with the same classification or binned in the same group instead of performing random sampling of commonly classified defects or commonly binned defects. For example, for each group into which defects were binned, DCI may be used for sampling instead of performing random sampling of the grouped defects. Using DCI for sampling, defects that have higher DCIs may be more heavily sampled. As such, defects that are more likely to affect yield may be more heavily sampled for review. Therefore, defect review may produce results that are particularly useful for identifying and classifying defects that are more likely to impact yield. The DCI may be used to sample not only systematic and potentially systematic defects but also random defects.

In some embodiments, the DCI could be recalculated after a defect review image (e.g., a SEM image) is acquired and aligned with the design (e.g., GDS) to achieve substantially "perfect" coordinate accuracy. For example, after SEM review, the method may include performing GDS-based classification for one or more reviewed defects. GDS-based classification may include aligning a SEM image acquired by defect review with GDS to remove any "coordinate error." GDS-based classification may also include using a 0.5 μm by 0.5 μm clip size to recalculate the DCI (a "high-resolution DCI"). In this manner, one or more reviewed defects (e.g., every reviewed defect) may have one "high-resolution DCI value." The embodiments described herein may also include any step(s) described in commonly owned U.S. patent application Ser. No. 11/950,961 to Fouquet et al. filed Dec. 5, 2007, which is incorporated by reference as if fully set forth herein.

In a similar manner, the method may include altering a process performed on the wafer based on the DCI determined for the defect. For example, the process may be a metrology process or involve one or more measurements on the wafer. In this manner, the method may include adapting a measurement process based, at least in part, on the DCI. In another example, the process is a defect review process. As such, the method may include adapting a defect review process based, at least in part, on the DCI. Altering the process as described above may include altering any one or more parameters of the process.

The DCI(s) determined as described herein may also be used to perform any other functions. For example, DCIs determined for multiple defects on a wafer or wafers can be used for defect Pareto shaping. In addition, patterns of interest (POIs) in the design for the wafer may be prioritized based on the DCIs for defects detected in the POIs, possibly in combination with other information about the defects detected on the wafer such as numbers of defects detected in or proximate the POIs. In this manner, prioritizing the POIs may include prioritizing the POIs based on defectivity exhibited by the POIs such that the POIs having higher defectivity are assigned higher priorities.

Additional functions performed on or for the POIs may then be performed based on the priorities assigned to the POIs. For example, the method may include prioritizing POIs in the design and optimizing one or more processes to be performed on wafers on which the design will be printed based on results of the prioritizing step. Optimizing one or more processes may include altering any one or more parameters of the one or more processes such as focus, dose, exposure tool, resist, post expose bake (PEB) time, PEB temperature, etch time, etch gas composition, etch tool, deposition tool, deposition time, etc. Preferably, the parameter(s) of the process(es) are altered to decrease defectivity of the POIs (e.g., number of defects detected in the POIs), to alter one or more attributes (e.g., DCI, etc.) of defects detected in the POIs, and/or to increase yield of devices in which the POIs are included.

In another example, the method includes altering an inspection process used to detect the defect based on the DCI determined for the defect. Altering the inspection process may include altering any one or more parameters of the inspection process. In addition, altering the inspection process based on the DCI may be performed using a feedback control technique. In one such example, if the DCI for the defect indicates that the defect is relatively critical, then the inspection process may be altered such that one or more locations on the wafer corresponding to the location of the defect may be inspected with a sensitivity that is higher than the sensitivity previously used to inspect these locations. Other parameter(s) of the process may be altered in a similar manner.

In an additional example, the method includes generating a process for inspection of additional wafers on which the design will be fabricated based on the DCI determined for the defect. In this manner, instead of altering a previously used inspection process in which the defect was detected, the method may include generating an entirely new inspection process. The new inspection process may be generated for any one or more layers of the additional wafers. For example, the process may be generated for the layer on which the defect was detected. However, such an inspection process may also be generated for one or more other layers of the additional wafers. For example, if the DCI for the defect indicates that the defect is relatively critical, then a process for inspecting a subsequently formed layer on the wafer may be generated by selecting one or more parameters of the inspection process such that one or more locations on the subsequently formed layer at which defects, which may be caused by the defect for which the DCI was determined, may potentially be located may be inspected with relatively high sensitivity. Other parameter(s) of the process may be selected in a similar manner.

Each of the embodiments described above may also include performing one or more defect-related functions such as those described in commonly owned U.S. patent application. Ser. No. 11/970,294 filed Jan. 7, 2008 by Park et al., which is incorporated by reference as if fully set forth herein. Furthermore, the embodiments described herein can be used for applications related to double patterning lithography (DPL), which is required for the 32 nm technology node.

Each of the embodiments of the method described above may include any other step(s) of any method(s) described herein. In addition, each of the embodiments of the method described above may be performed by any system embodiments described herein.

Any of the methods described herein may include storing results of one or more steps of one or more methods described herein in a storage medium. The results may include any of the results described herein. The results may be stored in any manner known in the art. In addition, the storage medium may include any storage medium described herein or any other suitable storage medium known in the art. After the results have been stored, the results can be accessed in the storage medium and used by any of the method or system embodiments described herein or any other method or system. Furthermore, the results may be stored "permanently," "semi-permanently," temporarily, or for some period of time. For example, the storage medium may be random access memory (RAM), and the results may not necessarily persist in the storage medium.

Figure 5:
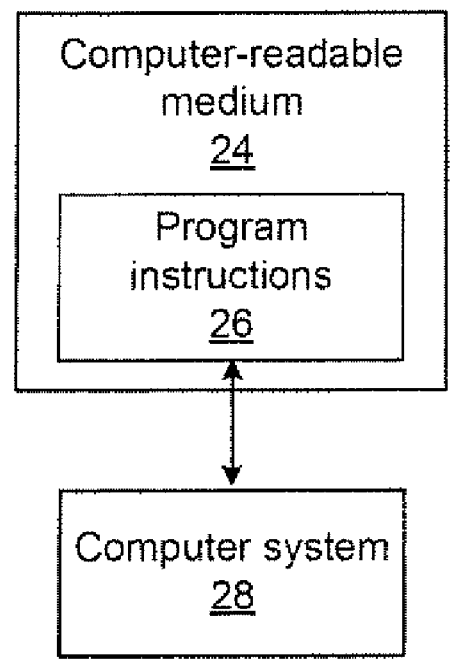
FIG. 5 is a block diagram illustrating one embodiment of a computer-readable medium that includes program instructions executable on a computer system for performing a computer-implemented method for determining a defect criticality index (DCI) for defects on wafers.

Another embodiment relates to a computer-readable medium that includes program instructions executable on a computer system for performing a computer-implemented method for determining a DCI for defects on wafers. One such embodiment is illustrated in FIG. 5. In particular, as shown in FIG. 5, computer-readable medium 24 includes program instructions 26 executable on computer system 28. The computer-implemented method includes determining critical area information for a portion of a design for a wafer surrounding a defect detected on the wafer by an inspection system based on a location of the defect reported by the inspection system and a size of the defect reported by the inspection system. Determining the critical area information may be performed according to any of the embodiments described herein.

The computer-implemented method also includes determining a DCI for the defect based on the critical area information, a location of the defect with respect to the critical area information, and the reported size of the defect. Determining the DCI may be performed according to any of the embodiments described herein. The computer-implemented method may include performing any other step(s) of any other embodiment(s) described herein.

Program instructions 26 implementing methods such as those described herein may be transmitted over or stored on computer-readable medium 24. The computer-readable medium may be a transmission medium such as a wire, cable, or wireless transmission link. The computer-readable medium may also be a storage medium such as a read-only memory, a random access memory, a magnetic or optical disk, or a magnetic tape. In addition, the computer-readable medium may include any other suitable computer-readable medium known in the art.

Computer system 28 may take various forms, including a personal computer system, mainframe computer system, workstation, image computer, parallel processor, or any other device known in the art. In general, the term "computer system" may be broadly defined to encompass any device having one or more processors, which executes instructions from a memory medium.

The computer system described above may be configured as a stand-alone system that does not form part of an inspection, metrology, review, or other tool. In such an embodiment, the computer system may be configured to receive and/or acquire data or information from other systems (e.g., inspection results from an inspection system) by a transmission medium that may include "wired" and/or "wireless" portions. In this manner, the transmission medium may serve as a data link between the computer system and the other system. In addition, the computer system may send data to the other system via the transmission medium. Such data may include any of the results of the methods described herein. In other embodiments, however, the computer system is included in an inspection system. The inspection system may be configured as described herein.

Figure 6:
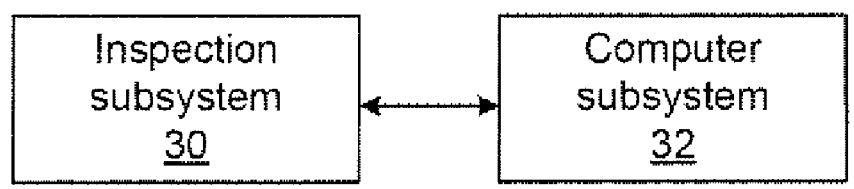
FIG. 6 is a block diagram illustrating one embodiment of a system configured to determine a DCI for defects on wafers.

An additional embodiment relates to a system configured to determine a DCI for defects on wafers. One embodiment of such a system is shown in FIG. 6. As shown in FIG. 6, the system includes inspection subsystem 30 configured to detect a defect on a wafer and to report a location of the defect and a size of the defect. Inspection subsystem 30 may include any suitable inspection subsystem such as those included in inspection systems described further herein. The inspection subsystem may be configured to detect the defect and to report the location and size of the defect in any suitable manner.

The system also includes computer subsystem 32 configured to determine critical area information for a portion of a design for the wafer surrounding the defect based on the reported location and the reported size of the defect. The computer subsystem may be configured to determine the critical area information according to any of the embodiments described herein. The computer subsystem is also configured to determine a DCI for the defect based on the critical area information, a location of the defect with respect to the critical area information, and the reported size of the defect. The computer subsystem may be configured to determine the DCI according to any of the embodiments described herein. In addition, the computer subsystem may be configured to perform any step(s) of any method(s) described herein. The computer subsystem may be further configured as described above with respect to computer system 28 shown in FIG. 5. The embodiment of the system described above may be further configured as described herein.

Further modifications and alternative embodiments of various aspects of the invention may be apparent to those skilled in the art in view of this description. For example, methods and systems for determining a DCI for defects on wafers are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for determining a defect criticality index for defects on wafers, comprising:

determining critical area information for a portion of a design for a wafer surrounding a defect detected on the wafer by an inspection system based on a location of the defect reported by the inspection system and a size of the defect reported by the inspection system; and determining a defect criticality index for the defect based on the critical area information, a location of the defect with respect to the critical area information, and the reported size of the defect, wherein the critical area information comprises a local critical area map.

2. The method of claim 1, wherein determining the defect criticality index is performed during inspection of the wafer by the inspection system.

3. The method of claim 1, further comprising determining defect criticality indexes for multiple defects detected on the wafer and filtering the multiple defects having the defect criticality indexes below a predetermined threshold.

4. The method of claim 1, further comprising determining defect criticality indexes for multiple defects detected on the wafer and filtering the multiple defects having the defect criticality indexes below a predetermined threshold from results of inspection as the inspection of the wafer is being performed by the inspection system.

5. The method of claim 1, further comprising determining detect criticality indexes for multiple defects detected on the wafer, ranking the multiple defects based on the defect criticality indexes, and performing one or more functions on the multiple defects based on the ranking.

6. The method of claim 1, wherein the critical area information further comprises critical area information for multiple types of fault mechanisms.

7. The method of claim 1, wherein the location of the defect with respect to the critical area information comprises a location of the defect within a critical area map.

8. The method of claim 1, wherein the critical area information is extracted from design data for the wafer.

9. The method of claim 1, further comprising determining the location of the detect with respect to the critical area information by aligning an image of the defect to a critical area map to determine a location of the defect in the design.

10. The method of claim 1, further comprising determining a location of the defect in the design by aligning an image of the defect to a design clip.

11. The method of claim 1, further comprising creating a critical radius map prior to inspection of the wafer from design data for the wafer, wherein the critical radius map is a critical area map in which each value in the critical area map is a radius of the size of the defect that can cause a limit in the design.

12. The method of claim 11, further comprising during the inspection of the wafer, sending a portion of the critical radius map corresponding to an area of the wafer being inspected to one or more image processors of the inspection system.

13. The method of claim 11, wherein determining the critical area information comprises when the defect is detected, extracting a local area of the critical radius map and creating the local critical area map by thresholding the critical radius map with the reported size of the defect.

14. The method of claim 11, wherein the critical radius map does not comprise the design data.

15. The method of claim 1, wherein determining the critical area information comprises when a defect is detected, extracting a design clip having a window size centered at the reported location of the defect, wherein the window size is greater than the sum of the uncertainty of the reported location of the defect and the uncertainty of the reported size of the defect, and determining the critical area information from polygons in the design clip.

16. The method of claim 15, wherein determining the defect criticality index comprises applying a probability distribution function to the critical area information and summing the probability.

17. The method of claim 15, wherein determining the defect criticality index comprises applying a probability distribution function to the critical area information and summing the probability, and wherein the probability distribution function reflects the uncertainty of the reported location of the defect and the uncertainty of the reported size of the defect.

18. A non-transitory computer-readable medium, comprising program instructions executable on a computer system for performing a computer-implemented method for determining a defect criticality index for defects on wafers, wherein the computer-implemented method comprises:

determining critical area information for a portion of a design for a wafer surrounding a defect detected on the wafer by an inspection system based on a location of the defect reported by the inspection system and a size of the defect reported by the inspection system; and determining a defect criticality index for the defect based on the critical area information, a location of the defect with respect to the critical area information, and the reported size of the defect, wherein the critical area information comprises a local critical area map.

19. A system configured to determine a defect criticality index for defects on wafers, comprising:

an inspection subsystem configured to detect a defect on a wafer and to report a location of the defect and a size of the defect; and a computer subsystem configured to:
determine critical area information for a portion of a design for the wafer surrounding the defect based on the reported location and the reported size of the defect; and determine a defect criticality index for the defect based on the critical area information, a location of the defect with respect to the critical area information, and the reported size of the defect, wherein the critical area information comprises a local critical area map.

* * * * *